(12) United States Patent
Bertolami

(10) Patent No.: US 6,215,674 B1
(45) Date of Patent: Apr. 10, 2001

(54) SLOTTED RAIL MOUNT FOR CIRCUIT BOARDS

(75) Inventor: Gwen Bertolami, Menlo Park, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/349,701

(22) Filed: Jul. 8, 1999

(51) Int. Cl.[7] ..................................... H05K 7/02
(52) U.S. Cl. ................... 361/807; 361/801; 361/683; 361/686; 361/727; 361/756; 439/78; 439/97; 174/52.1
(58) Field of Search ..................... 361/807, 801, 361/760, 683, 686, 724, 736, 737, 740, 756, 802; 439/95, 78, 97, 92; 174/52.1

(56) References Cited

U.S. PATENT DOCUMENTS

| 3,829,741 | * | 8/1974 | Athey | 361/756 |
|---|---|---|---|---|
| 3,932,016 | * | 1/1976 | Ammenheuser | 439/377 |
| 4,427,254 | * | 1/1984 | Koppensteiner | 439/476.1 |
| 5,432,682 | * | 7/1995 | Giehl et al. | 361/796 |
| 5,805,429 | * | 9/1998 | Andersson | 361/799 |
| 5,867,366 | * | 2/1999 | Klein et al. | 361/737 |
| 5,934,916 | * | 8/1999 | Latal et al. | 439/95 |
| 5,999,416 | * | 12/1999 | McAnally et al. | 361/816 |
| 6,088,222 | * | 7/2000 | Schmitt et al. | 361/686 |
| 6,114,626 | * | 9/2000 | Barnes et al. | 174/52.1 |
| 6,118,667 | * | 9/2000 | Grosser et al. | 361/752 |

* cited by examiner

Primary Examiner—Jayprakash N. Gandhi
Assistant Examiner—David Foster

(57) ABSTRACT

A slotted-rail mounting assembly for mounting an object having at least one flat surface, such as a printed circuit board, to a surface, such as the inner surface of a server or a PC enclosure. An object may be mounted to the surface using two or more slotted rail mounting assemblies. Each slotted rail mounting assembly comprises a slotted rail with slots that fit over raised brackets of a runner mounted to the surface. The slotted rail may be translated parallel to the runner in a central track formed by the runner on one side and guideposts on the other side in order to slide the slotted rail underneath the railed brackets, thus securing the slotted runner to the surface.

13 Claims, 6 Drawing Sheets

SLOTTED RAIL MOUNT FOR CIRCUIT BOARDS

TECHNICAL FIELD

The present invention relates to methods and systems for mounting printed circuit boards within enclosures and, in particular, to a slotted rail mount for mounting printed circuit boards within spatially constrained enclosures.

BACKGROUND OF THE INVENTION

Until recently, motherboards have been mounted into personal computers ("PCs") and servers using screws and mounting assemblies that require significant design efforts, assembly time, and perhaps most importantly, a potentially time consuming and complex procedure for replacement of the motherboard mounted within a fully assembled PC or server. Common motherboard mounting techniques currently require large, parallel cable connections for connecting the motherboards to other components within the PC or server. Moreover, mounting techniques often vary from vendor to vendor, so that a motherboard prepared for mounting within a PC or server manufactured by one vendor may not be interchangeable with a motherboard manufactured by a different vendor.

In order to address the above-mentioned motherboard mounting problems, Intel® has developed a rail-mounting system for motherboards manufactured according to the NLX motherboard specification standard. FIG. 1 shows a detailed view of an NLX rail mounting assembly. Raised brackets 102–107, that together comprise a runner, are punched up through the surface 108 of an enclosure or chassis. A plastic rail 110 is affixed to the lower surface of the motherboard 112 via screws 114–116. In the interest of brevity, the numerical labels used in FIG. 1 will be used again in FIGS. 2 and 3 to label components shown in FIGS. 2 and 3 that are also shown in FIG. 1. FIG. 2 shows a rail positioned prior to mounting onto the runner. The front end of the rail 110 is angled, or tapered, to form a blunt point 202 that is positioned above a first pair of raised brackets 102–103 of the runner. Prior to mounting, the rail 110 is collinear with a central track 204 of the runner and the bottom surface of the rail 110 is coplanar with the surface of the enclosure from which the raised brackets of the runner are punched. The motherboard (not shown in FIGS. 2 and 3) is mounted to the enclosure by sliding the rail 110 affixed to the motherboard into the central track 204 of the runner, so that the rail 110 is held in place by the raised brackets 102–107. FIG. 3 illustrates a rail positioned within the central track of a runner following mounting.

FIGS. 4 and 5 illustrate the use of the NLX motherboard mounting system in a server enclosure. The numerical labels used in FIG. 4 are reused in FIG. 5, for components shown in both figures, for the sake of brevity and clarity. In FIG. 4, a motherboard 402 is positioned for mounting into a server enclosure 404. The server enclosure includes two runners 406 and 408 into which rails 410 and 412, affixed to the underside of the motherboard 402, are slid in order to mount the motherboard 402 securely to the enclosure 404. The motherboard 402 is fully mounted when conductive electrical connectors 414, arranged along the lower edge of the motherboard 402, are snugly fit into a connector receptacle 416.

FIG. 5 shows the motherboard of FIG. 4 mounted within the server enclosure. Once the motherboard 402 has been slid into position, a hinged panel 502 is rotated 90 degrees about two hinges 504 and 506 and snapped into position to form the top of the enclosure 404. This hinged top surface 502 is necessary because, prior to mounting, the motherboard 402 must be positioned, as shown in FIG. 4, with the lower edges of the rails 416 and 418 above the first sets of raised brackets 420 and 422, respectively. Prior to mounting, the top portion of the motherboard 402 extends above the plane of the top of the server enclosure 424–426.

While the NLX rail mounting system, described above in FIGS. 1–5, addresses the above-mentioned problems related to standardization, ease of mounting and replacement, and cableless connection, the necessity of the motherboard to be positioned above the top runner brackets prior to mounting requires either a hinged surface that can be opened to accommodate insertion of the motherboard, as shown in FIGS. 4 and 5, or requires server enclosures having at least once dimension significantly greater than the vertical dimension of the motherboard. However, designers and manufacturers of servers and PCs, in response to consumer demand, strive to keep the size of servers and PCs as small as possible, and strive to minimize manufacturing costs. Design of the hinged top surface of the server enclosure, as shown in FIGS. 4 and 5, adds additional parts and labor costs to the manufacture of the server or PC, and perhaps more importantly, may result in a weakening of the mechanical structure of the enclosure. For these reasons, designers and manufacturers of PCs and servers have recognized the need for a motherboard mounting system compatible with the NLX standard that does not require the motherboard to slide for a significant distance along runners, and that therefore does not require the motherboard to be initially positioned above the top of the runners prior to mounting, as illustrated in FIG. 4.

SUMMARY OF THE INVENTION

In one embodiment of the present invention, two slotted-rail mounting assemblies are employed to mount a motherboard within a server enclosure. Each slotted-rail mounting assembly comprises a runner piece, having raised brackets and guide posts that together form a runner and a slotted rail that slides through a control track of the runner. The slotted rails are affixed to the lower surface of the motherboard. The runners are affixed to a surface of the enclosure. Each slotted rail has two slots that allow the slotted rail to be positioned over corresponding raised brackets of the runner piece and against a surface of the enclosure within the central track of the runner. The slotted rail can then be translated along the central track of the runner for a distance of approximately ½ inch in order to lock the slotted rail underneath the runner brackets, thus mounting the motherboard securely to the surface of the enclosure to which the runners are affixed. Because mounting of the motherboard via the slotted-rail mounting assemblies does not require the motherboard to slide for many inches across the surface of the enclosure, the motherboard can be mounted within a compact enclosure, without requiring a hinged panel or an aperture through which the motherboard can be inserted.

DETAILED DESCRIPTION OF THE INVENTION

One embodiment of the present invention is a slotted-rail mounting assembly for mounting a motherboard within a PC or server enclosure. Two slotted rails are affixed to the lower surface of a motherboard. These slotted rails, along with the affixed motherboard, can be positioned directly over two corresponding runners affixed to the surface of a PC or server enclosure. The motherboard, and affixed rails, can then be translated along the runners for approximately ½ inch in order to securely mount the motherboard to the enclosure and snugly to fit electrical connectors along the lower edge of the motherboard into a connector receptacle. The small, ½ inch distance over which the motherboard slides along the runners allows the motherboard to be mounted within a relatively tight enclosure, without the need for special apertures through which the motherboard would otherwise need to be inserted and removed.

Figure 1:
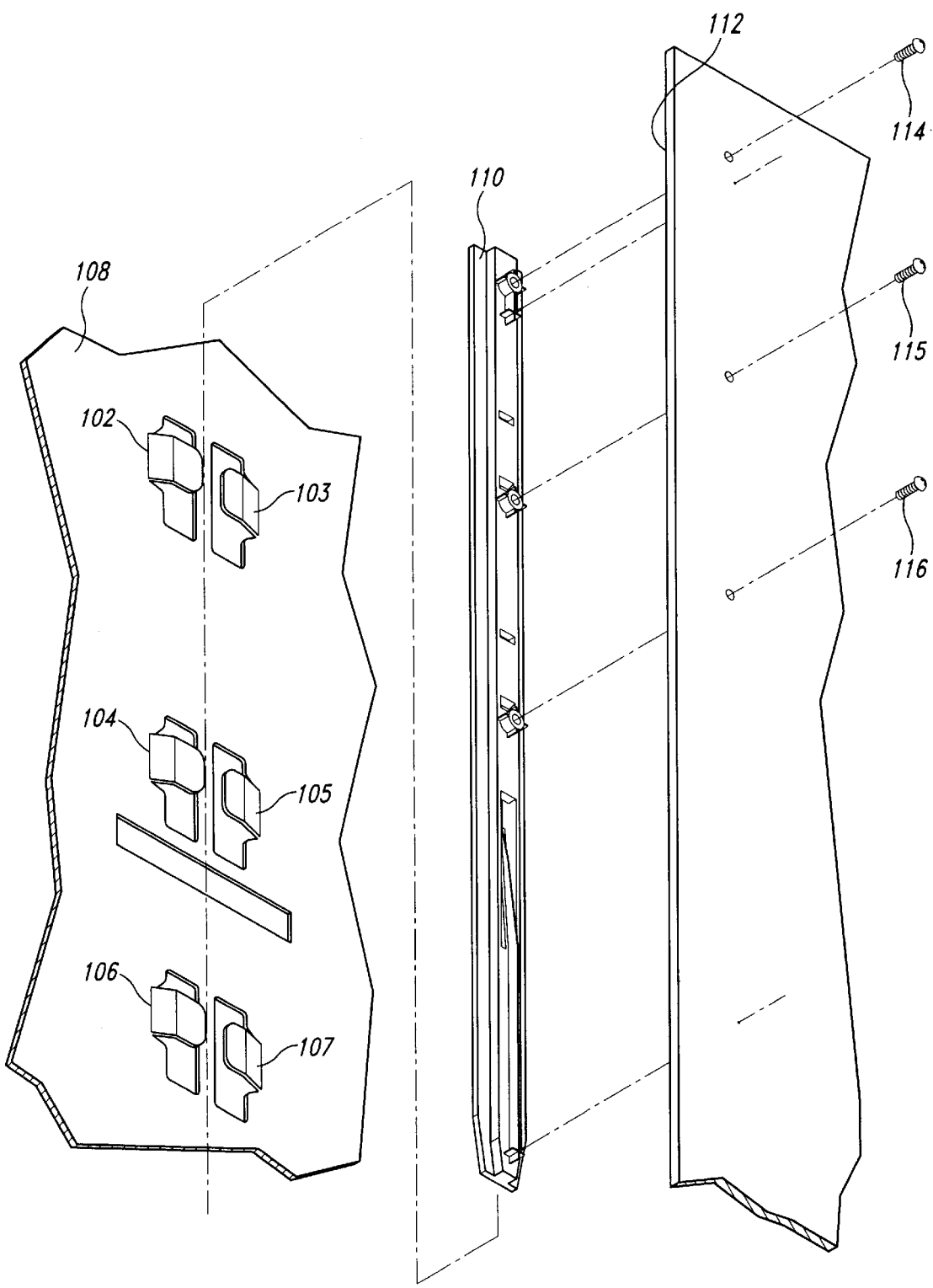
FIG. 1 shows a detailed view of an NLX rail-mounting assembly.
Figures 2, 3:
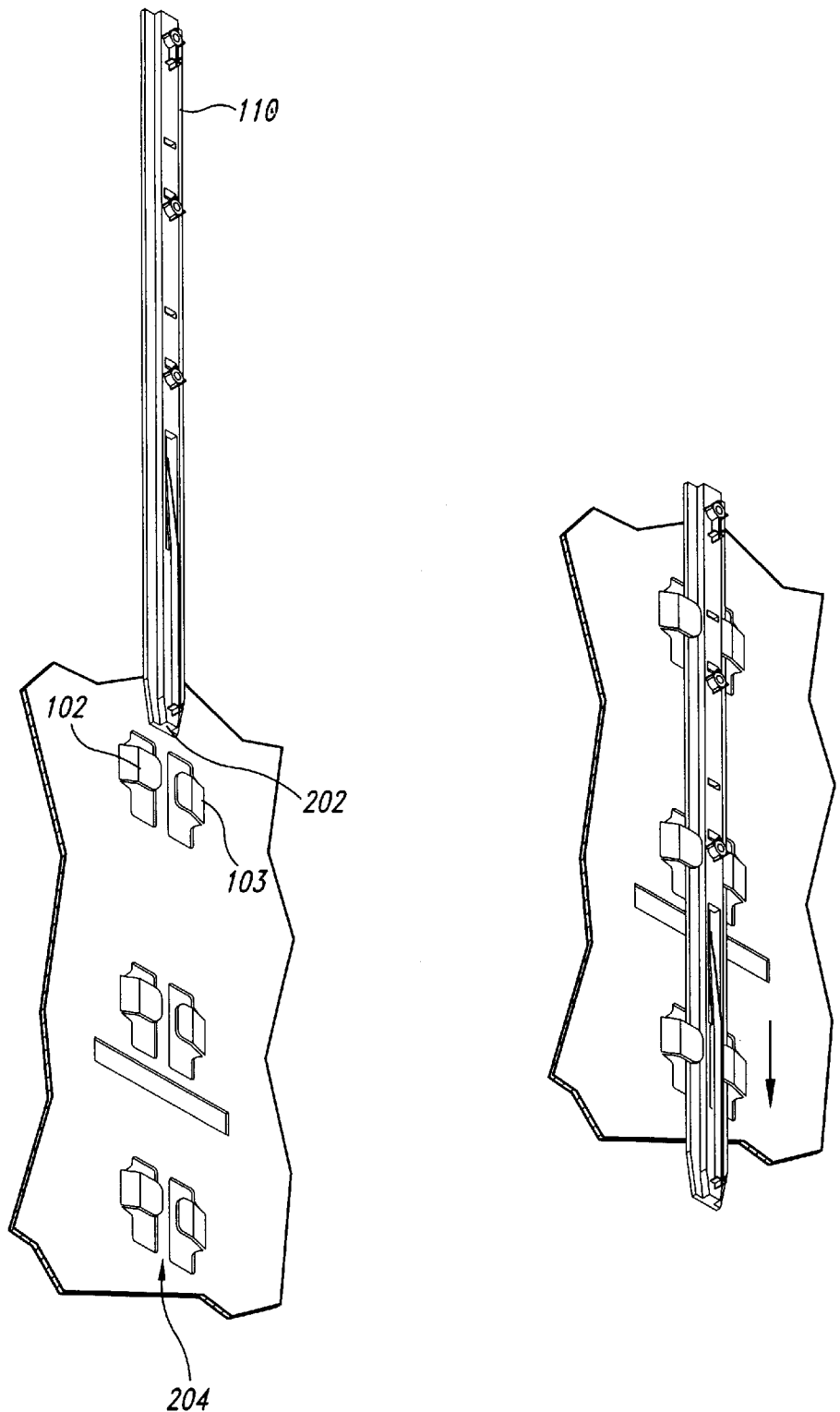
FIG. 2 shows a rail positioned prior to mounting.
FIG. 3 illustrates a rail positioned within the central track of the runner following mounting.
Figure 4:
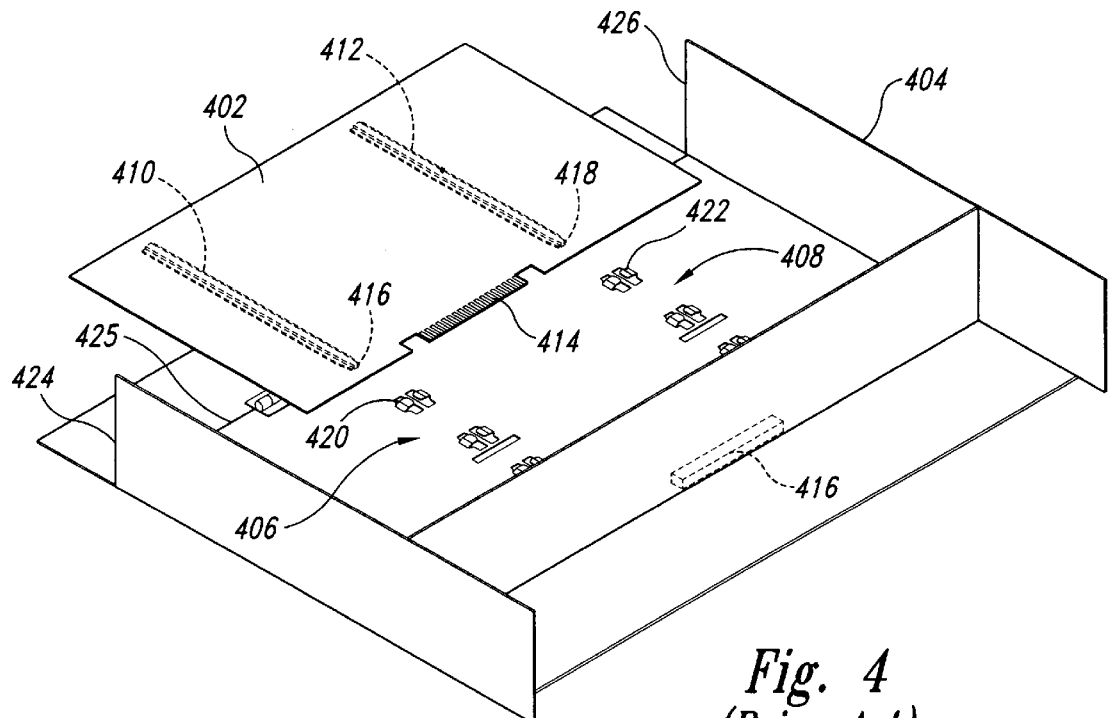
FIGS. 4 and 5 illustrate the use of the NLX motherboard-mounting system in a server enclosure.
Figure 5:
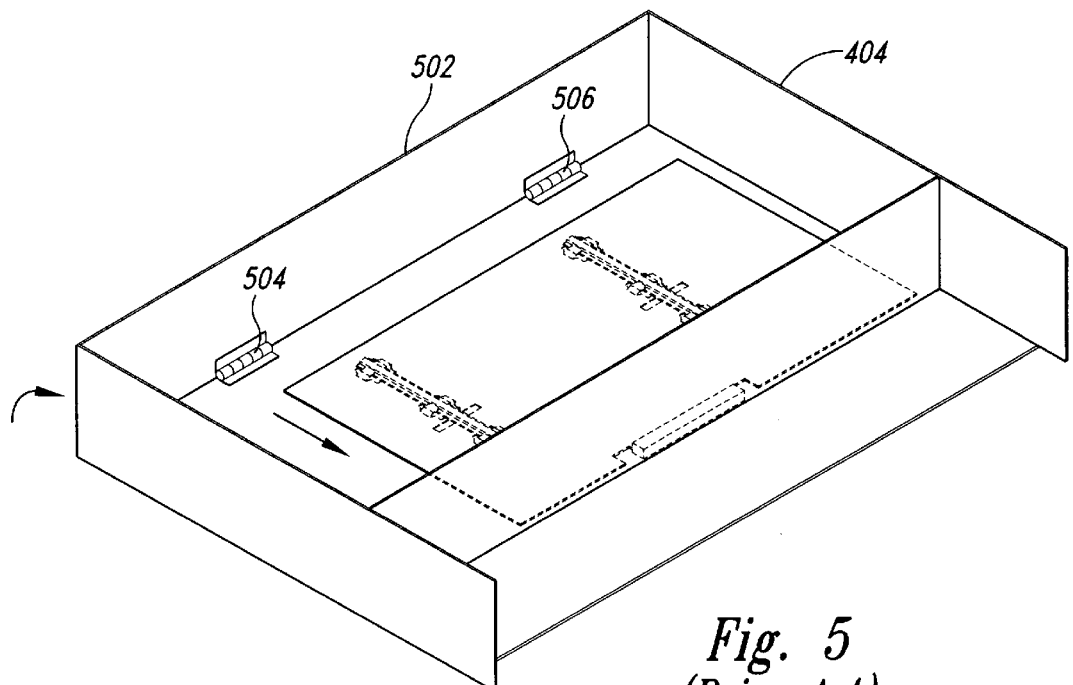
Figure 6:
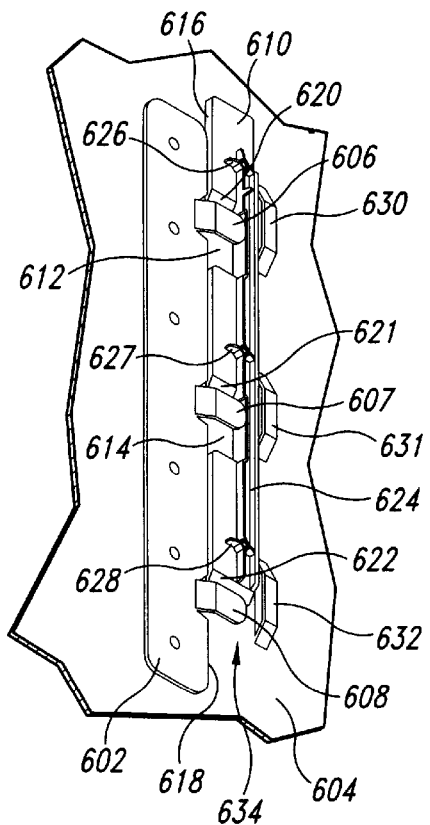
FIG. 6 is a detailed illustration of a single slotted rail initially positioned along a corresponding runner prior to mounting the slotted rail within the runner.
Figure 7:
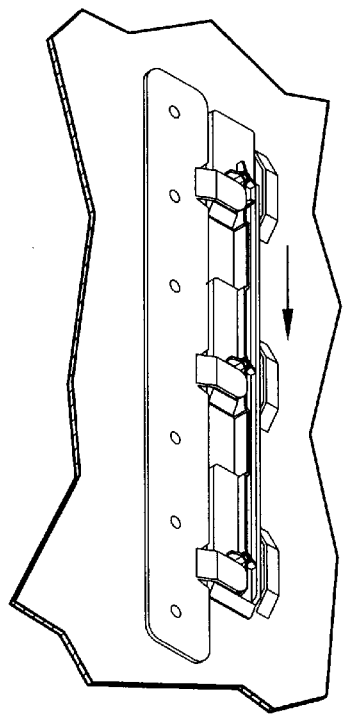
FIG. 7 shows a slotted rail in a mounted position underneath runner brackets.

FIG. 6 is a detailed illustration of a single slotted rail initially positioned along a corresponding runner prior to mounting the slotted rail within the runner. The runner 602 is riveted to an inner surface of an enclosure 604. The runner 602 includes three raised brackets 606–608. The slotted rail 610 has two slots 612 and 614 that allow the slotted rail 610 to be placed over the two runner brackets 606 and 607 and positioned so that the inner edge of the slotted rail 616 is flush with the inner edge 618 of the runner 602 and so that the bottom surface of the slotted rail (obscured in FIG. 6) is flush with the surface of the enclosure 604. The slotted rail 610 has three inclined faces 620–622, or ramps, that are positioned parallel to the runner brackets 606–608 to allow the slotted rail 610 to be slid downward underneath the runner brackets 606–608. The slotted rail additionally has raised surface features 624 that include vertical stops 626–628 that will rest against the top edges of the runner brackets 606–608 when the slotted rail 610 is slid downward into a final mounted position. Three raised guideposts 630–632 form the right-hand side of a central track 634 within which the slotted rail is translated downward in order to lock the slotted rail into a mounted position. FIG. 7 shows a slotted rail in a mounted position underneath runner brackets.

Figure 8:
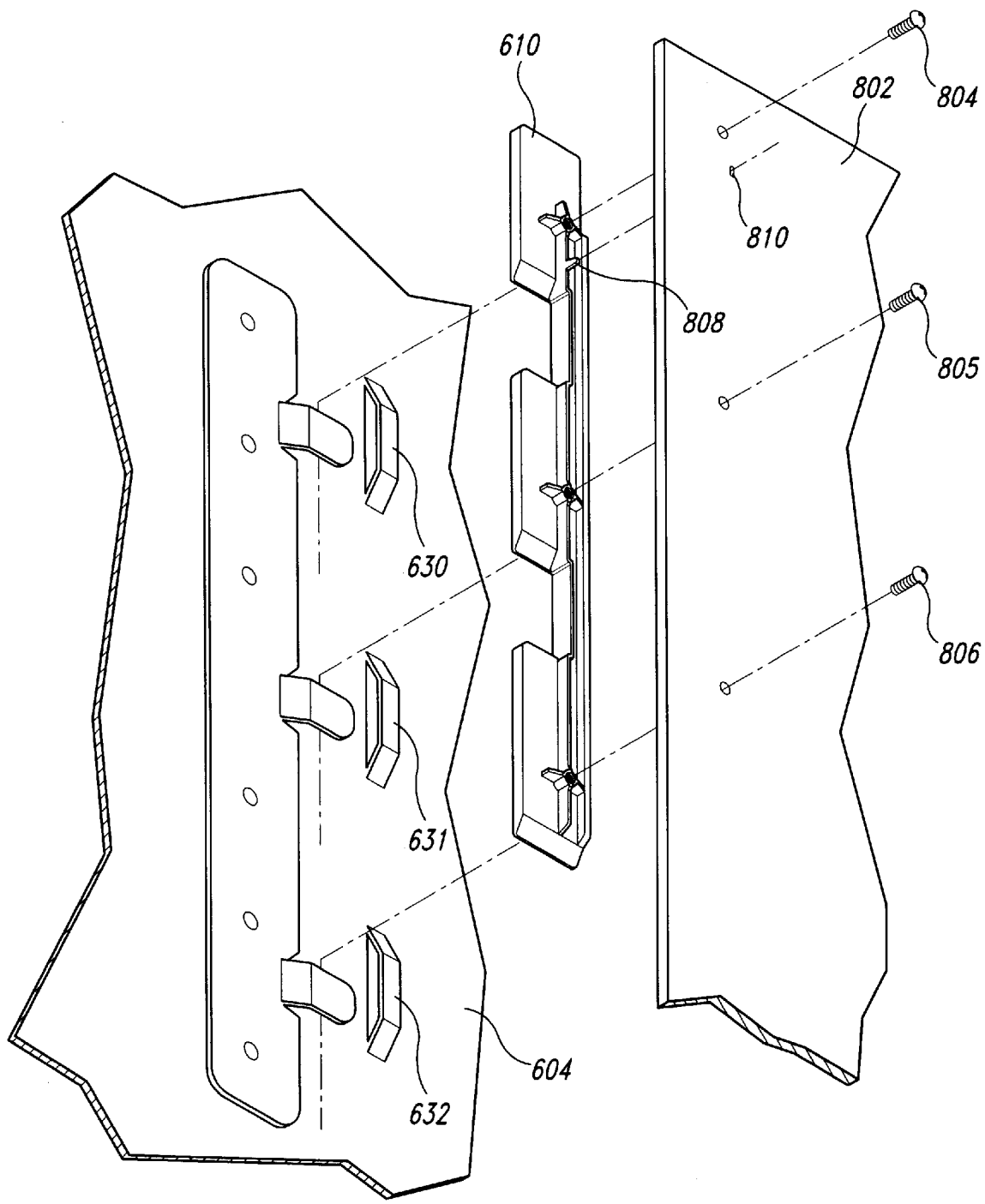
FIG. 8 is an expanded view of the slotted-rail mounting assembly shown in FIGS. 6 and 7.

FIG. 8 is an expanded view of the slotted-rail mounting assembly shown in FIGS. 6 and 7. Numerical labels used in FIG. 6 are reused in FIG. 8, where needed. The slotted rail 610 may be mounted to the motherboard 802 via screws 804–806. The three guideposts 630–632 are formed from the enclosure 604 by perforating the enclosure vertically, along both sides of the guideposts 630–632, and pressing, or stamping, the resulting vertical strips of enclosure material inward. The slotted rail 610 is molded from any number of different types of rigid plastic materials. The slotted rail 610 may also include a vertical mounting guide 808 that fits into an aperture 810 of the motherboard to allow for easy and accurate assembly.

Figure 9:
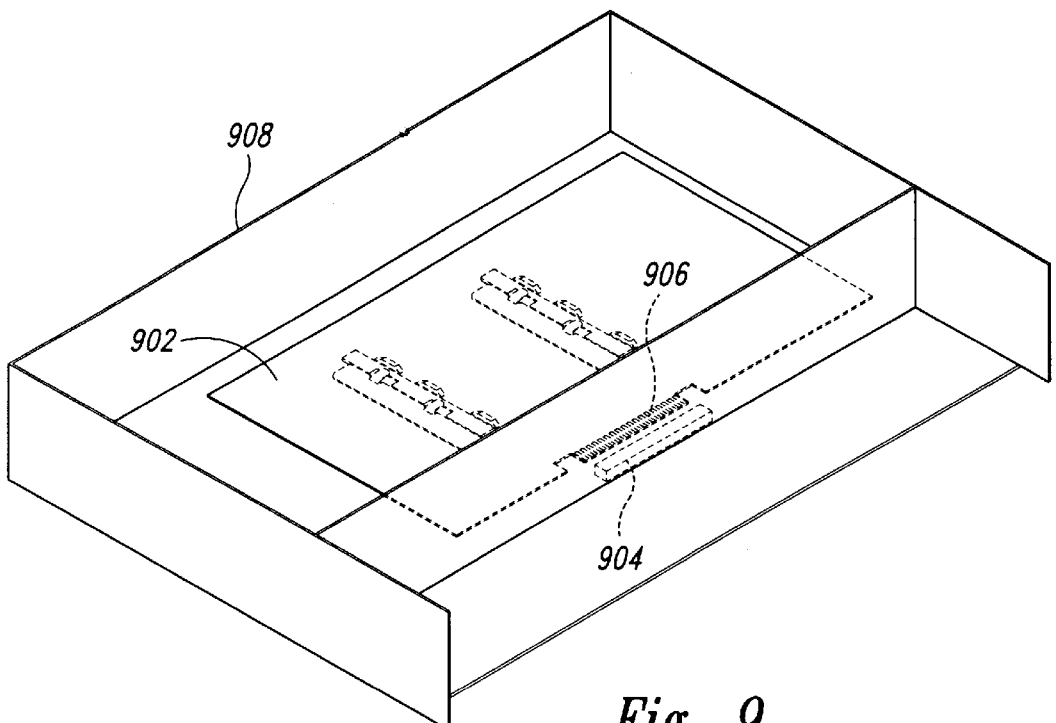
FIG. 9 shows a motherboard, with two attached slotted rails, positioned over two runners prior to mounting.
Figure 10:
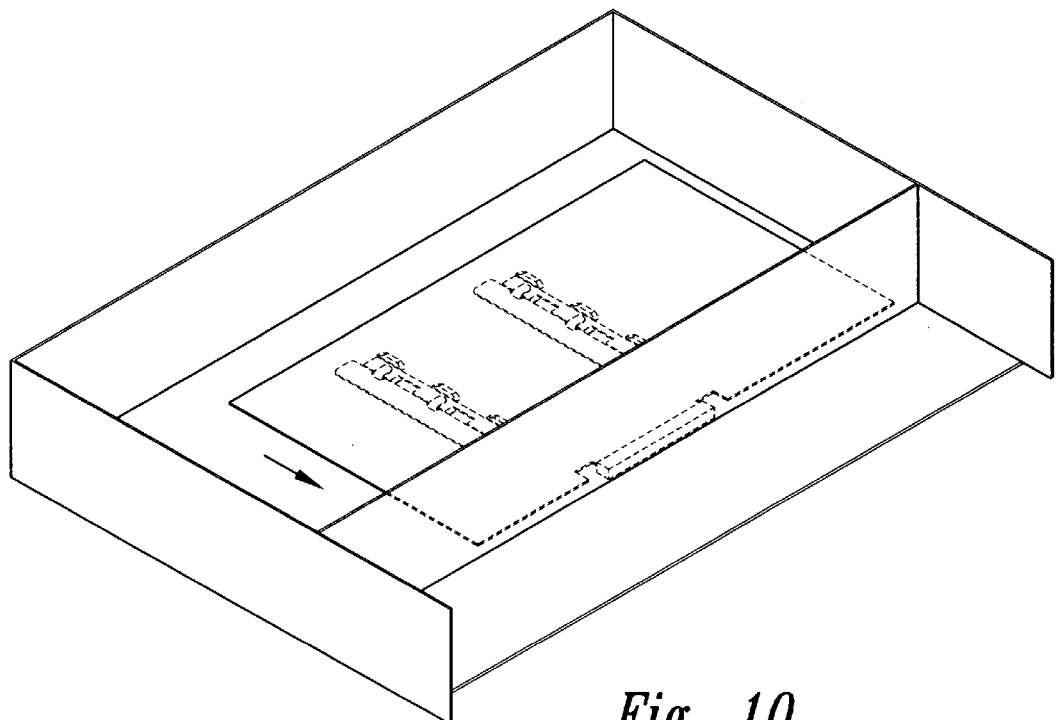
FIG. 10 shows a motherboard translated into a mounted position.

FIG. 9 shows a motherboard, with two attached slotted rails, positioned over two runners prior to mounting. The motherboard 902 is positioned approximately ½ inch from the connector receptacle 904 into which the connectors 906 along the lower edge of the motherboard will be inserted. Because the motherboard 902 needs to be translated only ½ inch during the mounting process, there is no need for the top of the enclosure 908 to be hinged or to contain an aperture through which the motherboard is inserted. FIG. 10 shows a motherboard translated downward into a mounted position, with electrical connectors snugly fitted within an electrical connector receptacle.

Although the present invention has been described in terms of a particular embodiment, it is not intended that the invention be limited to this embodiment. Modifications within the spirit of the invention will be apparent to those skilled in the art. For example, the slotted rail portion of the slotted-rail mounting assembly may be manufactured from a variety of different materials, including molded plastics, metal, ceramic materials, or other such rigid materials. In the described embodiment, the slotted rails have dimensions approximately equivalent to the Intel® NLX standard for motherboard rail mounting assemblies. In alternate embodiments, the slotted rail mounting assemblies may have different dimensions as required for securely mounting different types and sizes of components to surfaces. The slotted rail mounting system may be employed to mount other types of printed circuit boards within server and PC enclosures, or, more generally, may be employed to mount any number of different types of objects with at least one flat surface to another flat surface. The slotted rails of the slotted rail mounting assembly may contain different numbers of slots to correspond to different numbers of runner brackets included on the corresponding runners. A variety of lengths of travel required to mount the slotted rails underneath the runner brackets can be obtained by varying the dimensions of the slots and of the vertical surface features that act as stops. Mounting of large or heavy objects may require more than two slotted-rail assemblies. The slotted rails may employ different attachment mechanisms, other than servers, for attaching to an object. The guideposts may be separate parts affixed to the surface bearing the runners, or may be a second, long, single-piece opposing runner piece.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description; they are not intended to be exhaustive or to limit the invention to the precise forms disclosed, obviously many modifications and variations are possible in view of the above teachings. The embodiments were chosen and described in order to best explain the principles of the invention and its practical applications and to thereby enable others skilled in the art to best utilize the invention and various embodiments with various modifications as are suited to the particular use contemplated. It is intended that the scope of the invention be defined by the following claims and their equivalents:

What is claimed is:

1. A mount for mounting an object to a surface, the mount comprising:
    a runner, having a track edge and a number of raised brackets perpendicular to a long dimension of the runner, affixed to the surface;
    a guide rising from the surface, with edges parallel to the track edge of the runner and spaced apart from the runner to form a central track; and a rail affixed to the object, the rail having a mounting side and an attachment side, a leading end and a trailing end, and a slotted edge and an opposite edge, the rail having a number of slots positioned along the slotted edge of the rail so that the rail can be first positioned over the raised brackets of the runner, with the mounting side of the rail coplanar with the surface within the central track, the raised brackets protruding through the slots, the slotted edge parallel to the track edge of the runner, and the opposite edge parallel to the guide, and so that the rail can then be translated within the central track in a direction toward the leading end, the rail passes under the raised brackets, securing the object to the surface.

2. The mount of claim 1 wherein the edges of the slots facing toward the leading end, and the edge of the rail at the leading end, slope downward, from the attachment side of the rail to the mounting side of the rail, to create ramps facing the leading end that facilitate translation of the rail under the raised brackets.

3. The mount of claim 1 wherein the attachment side of the rail has raised, vertical features, parallel to a portion of the ramps, that rest against the raised brackets when the rail is translated to secure the rail underneath the raised brackets, the vertical features serving as stops to lock the rail in a mounted position.

4. The mount of claim 1 wherein the attachment side of the rail has vertical, threaded holes for receiving screws that affix the object to the rail.

5. The mount of claim 1 wherein a vertical member extends upward from the attachment surface of the rail to serve as a mounting guide for affixing the object to the rail, the vertical member fitting into a corresponding aperture on the surface of the object.

6. The mount of claim 1 wherein the object is a printed circuit board and the surface is an inner surface of an electronic component enclosure.

7. An object mounted to a surface by a number of mounts of claim 1, the mounts affixed to the object parallel one to another so that the rails of all the mounts translate in one direction in order to secure the tabs of the rails underneath the raised brackets of the runners.

8. A method for removably mounting an object to a surface in order to minimize translation of the object during mounting, the method comprising:

affixing a number of slotted rails to the object, each slotted rail having a mounting side and an attachment side, a leading end and a trailing end, and a slotted edge and an opposite edge, the rail having a number of slots along the slotted edge so that the slotted edge comprises a series of tabs interspersed with slots, the edges of the slots facing toward the leading end and the edge of the rail at the leading end sloping downward, from the attachment side of the rail to the mounting side of the rail, to create ramps facing the leading end, the attachment side of each rail affixed to the object;

affixing a number of runners corresponding to the number of slotted rails to the surface, each runner having a track edge and a number of raised brackets perpendicular to a long dimension of the runner;

forming a guide parallel to the track edge of each runner and spaced apart from the runner to form a central track;

positioning the object onto the surface such that the raised brackets of the runners protrude upward through the slots of the slotted rails, with the mounting side of the rails coplanar with the surface within the central tracks, the slotted edges of the rails parallel to the track edges of the runners, and the opposite edges of the rails parallel to the guide posts; and translating the object so that that the rails slide within the central tracks of the runners a sufficient distance to position the tabs of the rails underneath the raised brackets of the runners, securing the object to the surface.

9. The method of claim 8 wherein the attachments sides of the slotted rails include threaded apertures and wherein affixing a number of slotted rails to the object further includes inserting screws through apertures in the object and screwing the screws into the threaded apertures of the slotted rails, the slotted rails arranged parallel one to another so that they can be simultaneously translated within corresponding parallel central tracks of runners and guide posts on the surface.

10. The method of claim 9 wherein the attachments sides of the slotted rails include vertical guide members and wherein affixing a number of slotted rails to the object is facilitated by placing the vertical guide members into corresponding guide holes within the object.

11. The method of claim 8 wherein the attachments sides of the slotted rails include vertical features parallel to portions of the ramps, and translating the object so that that the rails slide within the central tracks of the runners a sufficient distance to position the tabs of the rails underneath the raised brackets of the runners further includes translating the object until the vertical features rest against the raised brackets, locking the object into a secure mounted position.

12. The method of claim 8 wherein the object is a printed circuit board and the surface is an inner surface of an electronic device enclosure.

13. The method of claim 12 wherein the printed circuit board is slidably and removably mounted within the enclosure such that hinged surfaces or apertures within the enclosure are not required in order to mount the printed circuit board within the enclosure.

\* \* \* \* \*